United States Patent [19]

Greer

[11] Patent Number: 4,757,283
[45] Date of Patent: Jul. 12, 1988

[54] TECHNIQUE FOR FREQUENCY TRIMMING OF A SAW DEVICE USING DIELECTRIC LAYERS DISPOSED BETWEEN A PAIR OF TRANSDUCERS OF THE SAW DEVICE

[75] Inventor: James A. Greer, Andover, Mass.
[73] Assignee: Raytheon Company, Lexington, Mass.
[21] Appl. No.: 42,068
[22] Filed: Apr. 24, 1987
[51] Int. Cl.⁴ .................... H03H 9/25; H03H 9/64
[52] U.S. Cl. .................... 333/195; 310/313 D; 333/153; 333/196
[58] Field of Search ................... 333/193–196, 333/150–155; 310/313 R, 313 A, 313 B, 313 C, 313 D; 29/25.35

[56] References Cited

U.S. PATENT DOCUMENTS 3,795,879 3/1974 Whitehouse et al. ...... 310/313 R X
4,243,960 1/1981 White et al. .................. 333/154 X
4,435,176 8/1982 Grudkowski et al. .......... 310/313 B

OTHER PUBLICATIONS

"Fine Tuning of Narrow-Band Saw Devices Using Dielectric Overlays", by C. N. Helmick, Jr. et al, 1977 Ultrasonics Symposium Proceedings, IEEE Cat. #77CH1264–ISU, pp. 659–663.
"Observations of Aging and Temperature Effects on Dielectric Coated Saw Devices", by Helmick et al, 1978 Ultrasonics Symposium Proceedings, IEEE Cat. No. 78CH 1344–ISU; pp. 580–585.

*Primary Examiner*—Marvin L. Nussbaum
*Attorney, Agent, or Firm*—Denis G. Maloney; Richard M. Sharkansky

[57] ABSTRACT

A surface acoustic wave device includes a substrate which supports surface acoustic wave propagation having a predetermined surface acoustic wave velocity characteristic and a pair of interdigitated transducers coupled to said surface wave propagation surface. The pair of interdigitated transducers are spaced by a region of said surface wave propagation surface. To adjust the surface wave velocity characteristic of said surface wave device, a thin layer of a nonconducting elastic material, such as aluminum oxide or zinc sulfide is deposited onto a portion of the region disposed between the pair of interdigitated transducers, to change the surface wave velocity characteristic of the surface wave device.

14 Claims, 2 Drawing Sheets

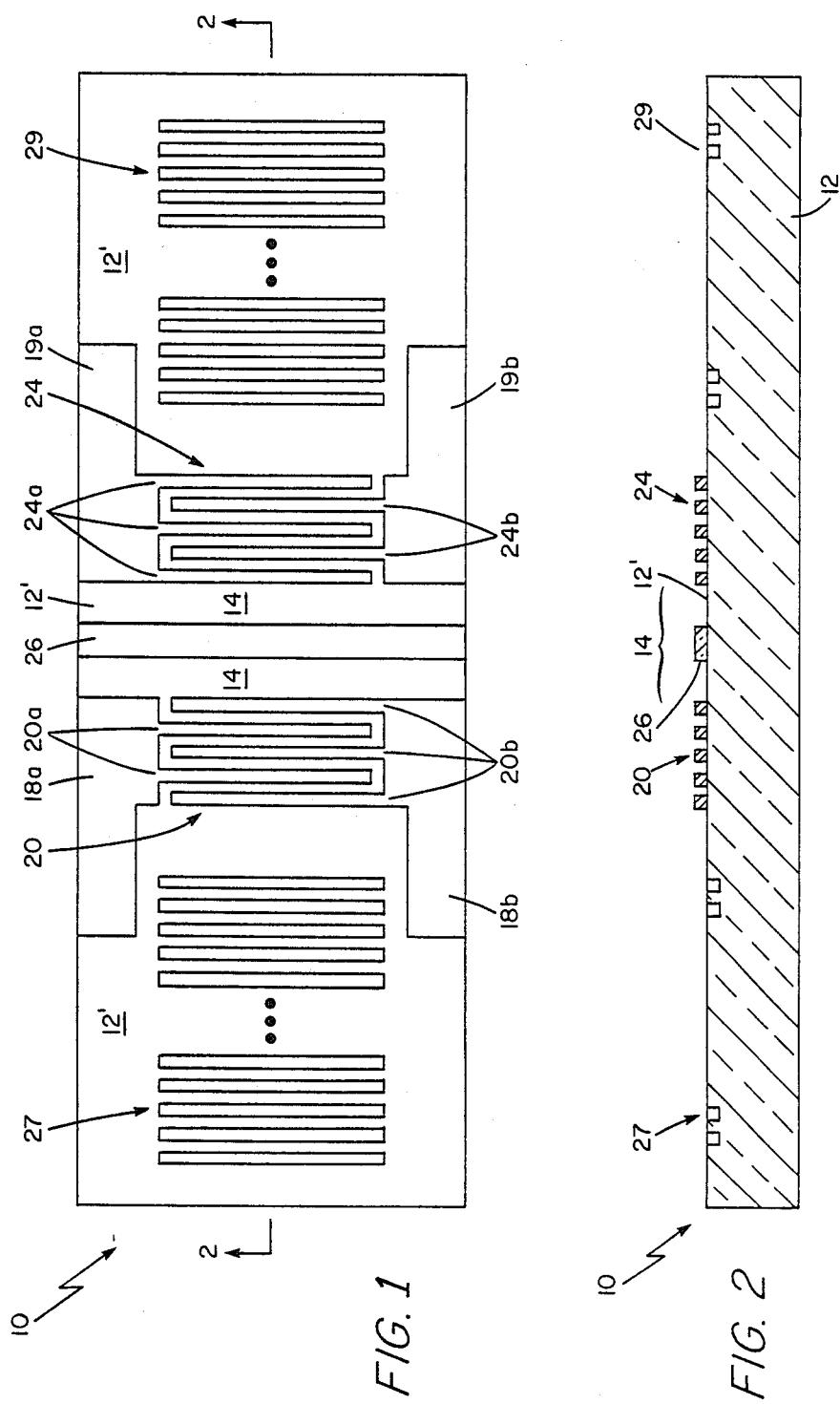

TECHNIQUE FOR FREQUENCY TRIMMING OF A SAW DEVICE USING DIELECTRIC LAYERS DISPOSED BETWEEN A PAIR OF TRANSDUCERS OF THE SAW DEVICE

BACKGROUND OF THE INVENTION

This invention relates generally to surface acoustic wave devices and more particularly to techniques for adjusting the surface acoustic wave velocity and, thus the frequency characteristics of a surface acoustic wave device.

As it is known in the art, surface acoustic wave devices such as resonators, delay lines, filters, and pressure transducers are used in a variety of applications. Generally, a surface acoustic wave device (SAW) comprises a pair of transducers, with each transducer having a set of conductive members which is disposed on or recessed within an upper portion of a surface which supports surface acoustic wave propagation. As surface acoustic wave devices find new applications, the requirements for precision in the frequency characteristics of the surface acoustic wave device increase. Accordingly, in many applications, it is now desired to have the center frequency of the device within ±1 ppm of the designed for center frequency. Many factors contribute to deviations from the designed for center frequency of a SAW device including the fabrication techniques presently used to manufacture SAW devices. Typically, with present techniques, the after fabricated SAW device has an actual center frequency within about ±100 ppm of the designed for center frequency. Accordingly, the frequency characteristic of the fabricated devices must be modified either upwards or downwards in frequency to meet the designed for center frequency.

Several techniques are commonly employed in the art to change the frequency characteristics of a SAW device. One technique known as air-baking involves exposing the SAW device to air disposed at an elevated temperature for a limited period of time to produce an upshift in the center frequency of the device. The utility of air-baking is relatively limited, however, since air-baking has not proven to be a reproducible technique, and furthermore, the amount of frequency shift obtained during the air-baking process is extremely limited particularly at frequencies below 500 MHz. A second technique involves etching techniques such as reactive ion etching. The reactive ion etching techniques involves sophisticated equipment, in which the SAW device is exposed to fluorine ions produced by a r.f. discharge. The fluorine ions selectively etch the surface wave propagation surface. The result of reactive ion etching is to trim down the center frequency of the SAW device. With reactive ion etching, frequency adjustment as much as −500 ppm may be obtained. Reactive ion etching, however, involves the use of relatively expensive and sophisticated equipment and, furthermore, the technique may involve relatively long etching times for devices in which a large frequency adjustment is necessary.

A second technique known in the art is set forth in U.S. Pat. No. 4,234,960 by David J. White et al and in papers entitled "Fine Tuning of Narrow-Band SAW Devices using Dielectric Overlay" 1977 Ultrasonic Symposium Proceeding, IEEE, pgs. 659–663 by Helmick et al. and "Observation of Aging and Temperature Affects on Dielectric Coated Saw Device", 1978 Ultrasonics Symposium Proceedings, IEEE, pp. 580–585 by Helmick et al. These papers and patent describe a technique in which a dielectric coating is provided on the surface wave propagation surface and in contact with the electrodes forming the interdigitated transducers, with the amount of frequency shift selected by controlling the thickness of the deposited coating. While the described technique produces frequency variations, these frequency variations come at the expense of a relatively large increase in the insertion loss of the device generally in the order of 1 db to 2 db, as well as, a relatively large increase in the so-called "turnover temperature" of the piezoelectric material which supports the surface acoustic wave propagation.

As it is known, some materials which are commonly employed to support surface wave propagation such as ST-cut and rotated ST-cuts of quartz, exhibit a parabolic surface wave velocity variation as a function of temperature. The maxima point of this parabolic variation is referred to as the turnover temperature. In many applications, the SAW device is designed to operate close to this temperature, particularly when the frequency stability of the SAW device is of critical importance. Large unpredictable variations in the turnover temperature would place the device out of specification for these applications, since the cut of the substrate material is specified for its particular temperature dependent characteristic. Accordingly, the large shifts in the turnover temperature described in the above references could make this technique impractical for use in many SAW device applications. Therefore, it is desirable to provide a technique which will have accurate and reproducible adjustments in frequency characteristics without significantly affecting other properties of the SAW device.

SUMMARY OF THE INVENTION

In accordance with the present invention, a method of adjusting the surface wave velocity characteristic of a surface acoustic wave device is provided. A substrate which supports surface acoustic wave propagation having disposed thereon a pair of spaced transducers coupled to the surface wave propagation is provided with at least one layer of a dielectric material over a selected region of the surface wave propagation surface. The selected region of the surface wave propagation surface is disposed between the pair of transducers. The amount of frequency adjustment provided by this technique is controlled by the percentage of the length of the region disposed between the pair of transducers which is covered by the layer of the dielectric material, as well as, by the thickness of the layer of the dielectric material. Upward or downward adjustments in the center frequency of the SAW device are provided by appropriate choice of the dielectric material. Thus, upward adjustments in the center frequency of the film material are provided by choosing materials having a surface wave propagation velocity which is higher than the surface wave propagation velocity of the material of the substrate, whereas downward frequency shifts are provided by choosing materials having a surface wave velocity characteristic which is lower than the surface wave velocity propagation characteristic of the material of the substrate. With this particular arrangement, by providing the layer of material within a portion of a region disposed between the pair of transducers but not over or touching the pair of transducers, large frequency shifts may be obtained without detrimental effects on other characteristics of the SAW device, such as noise, Q, aging rate, sealing shifts, insertion loss, and turnover temperature. Accordingly, an accurate and reproducible technique is provided which does not significantly affect other parameters of the surface acoustic wave device.

In accordance with a further aspect of the present invention, a surface acoustic wave device has a surface which supports surface acoustic wave propagation and an input transducer coupled to said surface wave propagation surface and an output transducer coupled to said surface wave propagation surface and spaced from said input transducer by a region of said surface acoustic wave propagation surface. A layer of dielectric material of either aluminum oxide for upward shifts or zinc sulfide for downward shifts is then disposed on a portion of the region of said surface wave propagation surface. The layer is provided with a predetermined thickness and covers a predetermined percentage of the length of the region disposed between said transducers to provide a selected change in the surface acoustic wave velocity characteristic of said surface. Preferably to select the amount of frequency adjustment, the layer is chosen to cover between 5% and 20% of the length of the region disposed between the pair of transducers, and the thickness of the layer is chosen to be less than 1% of the wavelength of the center frequency of the SAW device. With this particular arrangement, an accurate and reproducible technique for adjusting the surface wave velocity characteristic and hence, the frequency characteristics of SAW devices is provided without detrimental effects on other characteristics of the SAW device including noise characteristics, Q, aging rates, sealing shifts, insertion loss, and turnover temperature.

In accordance with a further aspect of the present invention, the substrate material is quartz and the dielectric material is aluminum oxide ($Al_2O_3$). The dielectric material is deposited by electron beam evaporation through a mask having a pattern which selectively exposes an underlying portion of the substrate, to provide a regular, uniform region of the material on the substrate between the pair of interdigitated transducer. The layer of material is disposed parallel to the transducer across the acoustic aperture of the SAW device. The percentage of the region covered is chosen in accordance with a gross estimate of the desired amount of frequency shift, and a precise amount of frequency shift is then provided by controlling the thickness of the layer while monitoring the frequency of the device during disposition of the layer.

BRIEF DESCRIPTION OF THE DRAWINGS

The foregoing features of this invention, as well as the invention itself, may be more fully understood from the following detailed description of the drawings, in which:

FIG. 1 is a plan view of a SAW resonator having a deposited trim pad in accordance with the present invention;

FIG. 2 is a cross-sectional view taking along lines 2—2 of FIG. 1;

DESCRIPTION OF THE PREFERRED EMBODIMENTS

Figure 3:
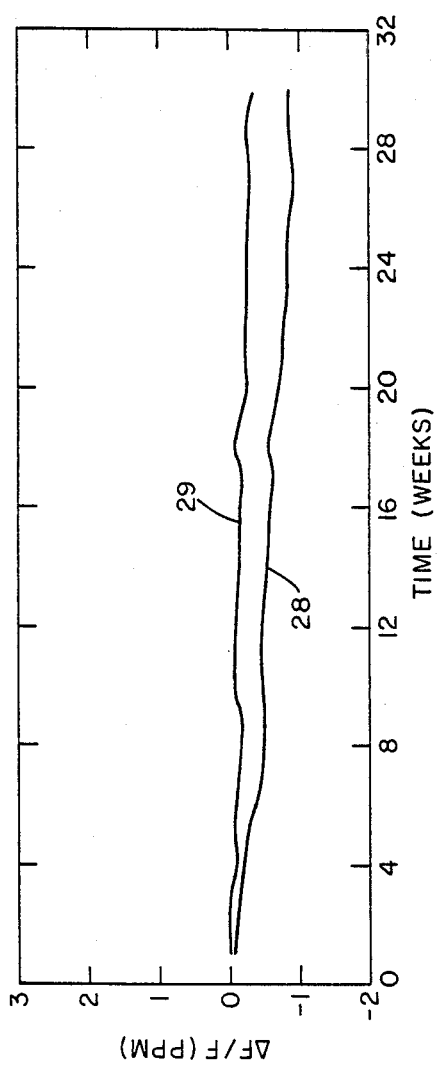
FIG. 3 is a plot of frequency variation (in PPM) vs time (in weeks) showing the long-term aging characteristics of the devices fabricated in accordance with the present invention, after sealing.

Referring now to FIGS. 1 and 2, a SAW device here a resonator 10 includes a base 12 having a surface 12' which supports surface acoustic wave propagation. Base 12 is comprised of a 36.7°±0.25° rotated ST-cut of quartz although other types of quartz including ST and other rotated ST-cuts of quartz, as well as other substrate materials, may alternatively be used. Base 12 supports a pair of interdigitated transducers 20 and 24 (IDT) and reflective gratings 27 and 29. The interdigitated transducers 20 and 24, each include conductive finger portions $20a$, $20b$, and $24a$, $24b$ coupled to the respective one of bus bars $18a$, $18b$ and $19a$, $19b$ as shown. Furthermore, the conductive fingers may be supported on the surface of the piezoelectric substrate 12 or alternatively may be recessed within grooves provided in the piezoelectric substrate 12. The transducers 20 and 24 are spaced by a region 14 of the piezoelectric substrate 12 disposed between the pair of transducers as shown. Within region 14, as shown, is provided a layer 26 of a dielectric material. The layer 26 of dielectric material is disposed to cover a portion of the region 14 and is mechanically isolated from the interdigitated transducers 20 and 24 and reflective gratings 27 and 29. The length $l_{26}$ the layer 26 between the transducers 20 and 40 covers from 5% to 90% of the length ($l_{14}$) of region 14 and is disposed parallel with the transducer 20 and 24 and completely across the acoustic aperture (not numbered) of the resonator 10. The layer 26 is comprised of a suitable dielectric material which provides a selected variation in the surface wave velocity characteristic of the substrate 12. Preferred candidates for the material to comprise layer 26 are aluminum oxide ($Al_2O_3$) for an increase in surface acoustic wave velocity and zinc sulfide (ZnS) for a decrease in surface acoustic wave velocity. Aluminum oxide being a relatively stiffer material than quartz and, accordingly, having a relatively higher surface wave velocity characteristic than quartz, will produce an increase or positive shift in the center frequency of the untrimmed surface acoustic wave device. Zinc sulfide being a less stiff material than quartz will have a slower surface wave velocity characteristic than quartz and, accordingly, will produce a decrease or negative shift in the center frequency of the surface acoustic wave device.

For lengths ($l_{26}$) of pad 26 less than the length $l_{14}$ of the region 14 disposed between the pair of transducers, and for thicknesses ($t_{26}$) of layer 26 of less than about 1% of the wavelength of the center frequency of the device, the frequency shift provided by the pad should be proportional to both the length of active acoustic region covered by the pad 26 and the thickness of the pad 26.

Several examples of SAW devices, here resonators, were fabricated and had the center frequency thereof adjusted in accordance with the present invention. The Table sets forth relevant data for these devices (examples 1-8), as well as, control samples (examples 9-12). In each of the examples 1-8, layer 26 is comprised $Al_2O_3$ and, therefore, positive shifts in frequency are provided. After fabrication and trimming, the devices were sealed with a piezoelectric matched quartz cover and glass frit seal. Measurements for insertion loss IL, and loaded and unloaded Q indicate small deviations subsequent to trimming.

After sealing, closed-loop noise expressed in $db_c/Hz$ at 10 Hz and approximate turnover temperature were measured. closed-loop noise for examples 1-6, and 8 show no significant variation from normally expected statistical scatter for this measurement, as can be seen by comparing these results with the data obtained from control examples 9-12. Turnover temperature which varied between 71° C. and 76° C. was again within the normally expected statistical scatter for this parameter when manufacturing tolerances for SAW resonators fabricated on 36.7°±0.25° ST-cut quartz are considered. Thus, the addition of layer 26 was not seen as changing turnover temperature in any significant manner. Accordingly, this technique of evaporating a thin pad 26 of a dielectric material, such as aluminum oxide within a portion of the region disposed between a pair of transducers, rather than evaporating a film completely over SAW device touching the transducers and surface wave propagation surface, provides controlled, accurate, and reproducible shifts in center frequency of the SAW devices without significant detrimental effects on other properties of the SAW devices, such as insertion loss and turnover temperature.

and oxygen in the aluminum oxide disposed on the surface of the piezoelectric substrate.

Standard techniques may be used to selectively deposit the layer 26. For example, the substrate 12 having the interdigitated transducers 20 and 24 is provided with a first layer (not shown) of a resist, here an AZ type of photoresist. The photoresist layer is patterned using conventional photolithographic techniques to provide an aperture (not shown) which exposes an underlying portion of the piezoelectric substrate. The aperture is chosen to expose a predetermined amount of the area of the region 14 (FIG. 1) disposed between the pair of transducers. A layer 26 of dielectric material is deposited through the aperture and over the photoresist layer. After the material has been deposited to a predetermined thickness to provide the estimated desired frequency shift, the photoresist layer is removed from the device leaving the device 10 having the layer 26, as shown in FIG. 2.

Alternatively, a metal mask disposed over the surface wave propagation surface may be used to produce the desired pattern. Since the mask is over but not on the surface, the frequency of the device may be monitored

TABLE

| EXAMPLE NO. | LAYER 26 Length, Thickness | $f_{INIT}$ (MHz) @ 67° | $f_{PAD}$ (MHz) @ 67° | f (KHz) | f/f (PPM) | IL (db) | $Q_{LINI}$ | $Q_{LPAD}$ |
|---|---|---|---|---|---|---|---|---|
| 1 | .010" | 401.823 | 401.857 | +34 | +85 | −.25 | 10,045 | 11,480 |
| 2 | 116A | 401.819 | 401.854 | +35 | +87 | −.35 | 9,130 | 8,929 |
| 3 | .027" | 401.809 | 401.958 | +149 | +371 | −.65 | 10,860 | 10,048 |
| 4 | 116A | 401.824 | 401.965 | +141 | +351 | −.85 | 10,045 | 10,045 |
| 5 | .010" | 401.828 | 401.892 | +64 | +159 | −.20 | 10,045 | 10,716 |
| 6 | 269A | 401.827 | 401.893 | +66 | +164 | −.45 | 10,570 | 10,046 |
| 7 | .027 | 401.830 | 402.067 | 237 | 589 | −.8 | 10,860 | 9,455 |
| 8 | 269A | 401.841 | 402.077 | 236 | +587 | −1.4 | 10,300 | 10,051 |
| 9 | CONTROL | 401.848 | — | — | — | — | — | — |
| 10 | CONTROL | 401.852 | — | — | — | — | — | — |
| 11 | CONTROL | 401.786 | — | — | — | — | — | — |
| 12 | CONTROL | 401.903 | — | — | — | — | — | — |

| EXAMPLE NO. | SEAL SHIFT (PPM) | $f_{SEAL}$ (MHz) @ 67° | IL (db) | $Q_L$ | $Q_{UN}$ | CLOSED-LOOP MEASUREMENTS #1 dbc/hz @ 10 hz | #2 | #3 | TURNOVER TEMP. °C. |
|---|---|---|---|---|---|---|---|---|---|
| 1 | +50 | 401.877 | 6.80 | 12,365 | 22,483 | | | | |
| 2 | +35 | 401.868 | 8.25 | 10,716 | 17,567 | −61.6 | −62.5 | −62.3 | 71 |
| 3 | +85 | 401.992 | 7.0 | 13,399 | 24,362 | −75.6 | −73.7 | −75.5 | 74 |
| 4 | +99 | 402.005 | 7.3 | 12,562 | 22.039 | −73.9 | −73.2 | −71.6 | 75 |
| 5 | +45 | 401.910 | 6.7 | 13,396 | 25,516 | −75.7 | −76.4 | −73.6 | 72 |
| 6 | +40 | 401.909 | 7.0 | 12,178 | 22,142 | −72.2 | −74.6 | −74 | 72 |
| 7 | DAMAGED | | | | | | | | |
| 8 | +112 | 402.122 | 7.7 | 13,403 | 22,911 | −74.0 | −77.7 | −76.3 | 76 |
| 9 | +30 | 401.860 | 7.0 | | | −75.6 | −75.7 | −76 | 70 |
| 10 | +40 | 401.868 | 6.7 | 11,480 | 24,353 | −78.9 | −77.6 | −76.2 | 72 |
| 11 | +32 | 401.799 | 6.4 | 12,145 | 23,800 | −69.6 | −69.3 | −69.7 | — |
| 12 | +45 | 401.921 | 6.4 | 11,481 | 22,962 | −68.1 | −65.1 | −67.3 | 74 |

Note:
All devices were resonators
$L_{14}$ = 0.0615 inches
Substrate 12 material 36.7° rotated ST-cut quartz
Nominal Turnover Temperature 72° C.

Any technique may be used to deposit dielectric layer 26. Preferably, however, layer 26 is deposited using standard electron beam evaporation techniques. Moreover, since films such as aluminum oxide when deposited using standard electron beam techniques may provide an aluminum oxide deficient in oxygen close to the surface of the surface wave propagation surface, it is believed that even better results may be obtained by depositing the aluminum oxide film in an atmosphere containing oxygen. This technique will restore the proper stoichiometric relationships between aluminum during disposition to provide the desired frequency shift.

FIG. 3 shows the aging characteristic for examples Nos. 6 and 4 curves 28 and 29 respectively. From FIG. 3 and the Table, it appears that a narrow, thick layer 26 has less effect on sealing induced frequency shifts and more effect on aging induced frequency shifts, than a long thin layer 26. Accordingly, for high precision applications, it is preferred to cover between about 5% and 20% of the length of the region 14 between the transducers unless aging characteristics are important in which case high percentages of the region may be used.

Figure 4:
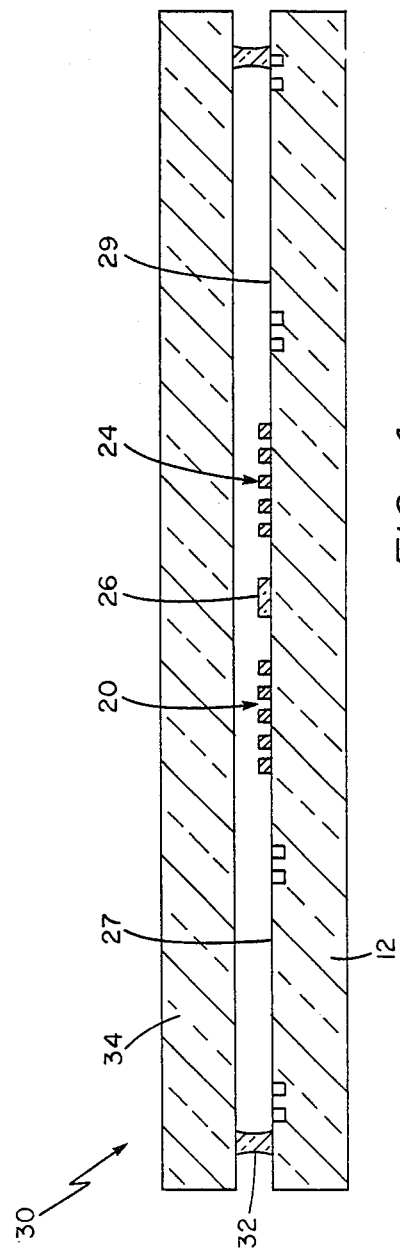
FIG. 4 is a cross-sectional view of the SAW device of FIGS. 1 and 2 packaged in a SAW device package.

Referring now to FIG. 4, after trimming, the SAW device 10 (FIGS. 1, 2) is sealed in a package 30. Here preferable the SAW device is sealed in an all-quartz package 30 by providing a seal ring of a glass frit 32 between the substrate 12 and a crystalographic matched quartz cover 34, as shown. The cover 34 is chosen such that the bus bars (not shown) are exposed along the longitudinal edges of the substrate 12. Other types of packages such as a TO-8 can-type may alternatively be used.

Post-sealing shifts may be handled as discussed in my co-pending application Ser. No. 944,911 filed Dec. 22, 1986 entitled "SAW Device" and assigned to the assignee of the present invention.

Having described a preferred embodiment of the invention, it will now become apparent to one of skill in the art that other embodiments incorporating its concept may be used. It is felt, therefore, that these embodiments should not be limited to disclosed embodiment but rather should be limited only by the spirit and scope of the appending claims.

What is claimed is:

1. A method of changing a center frequency of a surface acoustic wave resonator comprises the steps of:
    providing a substrate which supports surface acoustic wave propagation, said substrate supporting a pair of reflecting gratings and a pair of transducers spaced by a first region and coupled to said surface wave propagation surface with said transducers disposed within a second region between said pair of reflecting gratings; and
    providing a layer of a dielectric material having a thickness less than about 1% of the wavelength of the corresponding center frequency of the device on and across a portion of the first region said surface wave propagating surface with said layer being substantially parallel to and not touching said pair of transducers to change said center frequency.

2. The method of claim 1 wherein the portion of said surface wave propagation surface is between 5% and 90% of the length of the first region of the surface disposed between the pair of transducers.

3. The method of claim 2 wherein the portion of said surface wave propagation surface is between 5% to 20% of the length of the first region of the surface disposed between the pair of transducers.

4. The method of claim 3 wherein said dielectric material is selected from the group consisting of aluminum oxide and zinc sulfide.

5. The method of claim 4 wherein said substrate comprises quartz.

6. The method of claim 5 wherein said step of providing the dielectric layer comprising the steps of:
    masking said surface which supports surface wave propagation to expose said portion of said surface which supports surface wave propagation; and
    depositing the dielectric material onto said exposed portion of said surface.

7. The method of claim 6 wherein the center frequency of the resonator is monitored during the depositing step.

8. The method of claim 7 wherein the step of depositing the dielectric material further comprises the step of controlling the thickness of the material to provide a predetermined frequency shift.

9. The method of claim 8 wherein the dielectric is $Al_2O_3$ and during the depositing step, the $Al_2O_3$ is deposited onto said surface in an atmosphere including oxygen.

10. A surface wave resonator device having a center frequency characteristic comprising:
    a substrate having a surface which supports surface acoustic wave propagation;
    a pair of reflecting gratings disposed in said surface wave propagation surface;
    an input transducer coupled to said surface acoustic wave propagation surface;
    an output transducer coupled to said surface wave propagation surface, and spaced from said input transducer by a first region of said surface acoustic wave propagation surface with said input and output transducer disposed in a second region of said surface wave propagation surface which is between said pair of reflecting gratings; and
    a layer of a dielectric material disposed on a portion of said first region of said surface wave propagation surface and not touching said input and output transducer, said layer having a selected percentage of coverage of the length of said first region and a predetermined thickness less than about 1% of the corresponding wavelength of the center frequency of the device, to provide a selected change in the center frequency of the device.

11. The device as recited in claim 10 wherein the substrate comprises quartz.

12. The device as recited in claim 11 wherein the dielectric material is selected from the group consisting of aluminum oxide and zinc sulfide.

13. The device as recited in claim 12 wherein said layer of dielectric material covers between about 5% and 90% of the length of the first region disposed between said pair of interdigitated transducers.

14. The device as recited in claim 12 wherein said layer of dielectric material covers between about 5% to 20% of the length of the first region disposed between said pair of interdigitated transducers.

* * * * *